United States Patent [19]

Arvikar et al.

[11] Patent Number: 4,995,149

[45] Date of Patent: Feb. 26, 1991

[54] METHOD FOR HERMETICALLY SEALING ELECTRONIC DEVICES

[75] Inventors: Ram J. Arvikar, N. Andover, Mass.; John W. Benko, Trenton, N.J.; Alexander Coucoulas, Basking Ridge, N.J.; Thaddeus Wojcik, Hopewell, N.J.

[73] Assignee: AT&T Bell Laboratories, Murray Hill, N.J.

[21] Appl. No.: 498,789

[22] Filed: Mar. 26, 1990

[51] Int. Cl.$^5$ ............................................. H01L 41/22
[52] U.S. Cl. ..................................... 29/25.35; 65/42; 65/138; 310/313 R; 310/344
[58] Field of Search ................. 29/25.35; 65/42, 138; 53/478; 310/313 R, 344; 333/193–196; 174/52.3

[56] References Cited

U.S. PATENT DOCUMENTS

| | | | |
|---|---|---|---|
| 4,507,907 | 4/1985 | Wolfson | 53/478 |
| 4,560,084 | 12/1985 | Wolfson | 220/359 |
| 4,571,921 | 2/1986 | Wolfson | 53/373 |

OTHER PUBLICATIONS

"Surface Acoustic Wave Devices," by M. B. N. Butler, *Electronic Engineering*, Jun. 1980, pp. 37–44.

E. B. Shand, "Glass–Metal Seals," in *Glass Engineering Handbook*, edited by The Maple Press Company, York, Pa. (McGraw-Hill Book Company, Inc. 1958) pp. 127–128.

"A New Hall Quartz Package for SAW Devices," by T. E. Parker et al., 39*th Annual Frequency Control Symposium*, 1985, Raytheon Research Division, Lexington, MA 02173, pp. 519–525.

*Primary Examiner*—Carl E. Hall
*Attorney, Agent, or Firm*—R. B. Anderson

[57] ABSTRACT

An electronic device package is made by first making in a stencil member (11) an opening (12) in the shape of a closed loop that surrounds an inner portion (13) of the stencil member. The closed loop is a continuous opening except for a plurality of web members (15), each of which extends across the opening to secure the inner stencil portion to the remainder of the stencil member. A glass slurry (7) is forced through the opening of the stencil member onto a first substrate (18) so as to form on the substrate a substantially closed loop of glass slurry, which is thereafter glazed to form a glass loop (32) bonded to the first substrate. The first substrate is used as cover plate and placed over a second substrate (24) containing an electronic device (23) such that the glass loop surrounds the electronic device and contacts the second substrate along its entire length. The glass is heated sufficiently to soften it and cause it to bond to the second substrate as well as the first substrate. Cooling of the glass loop develops continuous hermetic seals to both first and second substrate, thereby to isolate the electronic device from the external environment.

16 Claims, 1 Drawing Sheet

METHOD FOR HERMETICALLY SEALING ELECTRONIC DEVICES

TECHNICAL FIELD

This invention relates to methods for making packages for electronic devices, and, more particularly, to methods for making relatively inexpensive hermetically sealed packages for electronic devices.

BACKGROUND OF THE INVENTION

Many electronic devices are so sensitive to contamination from the environment that it is necessary to enclose them within a hermetically sealed package, that is, a package through which substantially no air or contaminants can enter from the external environment under conditions of normal use. One example of an electronic device that requires hermetic sealing in this manner is an electronic device filter known as the surface acoustic wave (SAW) device, as described, for example, in the paper of B. M. Butler, "Surface Acoustic Wave Devices," *Electronic Engineering,* June 1980, pp. 37-44. This device normally comprises a pair of metalized leads on a quartz plate which are terminated by transducers. Another pair of metalized leads are terminated by transducers a short distance away. Electronic energy in one pair of leads is converted by the corresponding transducers to acoustic power, which travels along the surface of the quartz plate to the opposite transducers, which converts it back to electronic energy. As is known, this process of converting the electrical energy to acoustic energy and back again to electrical or electronic energy can be used to perform desirable filtering functions on the electrical energy.

Since the acoustic wave energy travels on the surface of the quartz plate, it is particularly important that such surface be kept free of contaminants that could reflect or otherwise interfere with propagating surface acoustic wave energy. For this reason, it is customary to hermetically seal each SAW filter device in a hermetically sealed "can" or package. The hermetically sealed package, typically comprising metal elements sealed by metal bonding techniques, constitutes by far the major portion of the cost of the finished device since the device itself, being constituted only of a quartz plate and deposited metal films, can be made very inexpensively.

There are numerous other examples in which the cost of the hermetic package greatly exceeds the cost of the electronic device being hermetically sealed. There has therefore been a long-felt need for a less expensive method for dependably hermetically sealing electronic devices from the external environment.

SUMMARY OF THE INVENTION

In accordance with the invention, the cost of making hermetically sealed packages is significantly reduced by making use of inexpensive package members, making use of glass sealing techniques, and making use of stencil printing techniques. A package is made by first making in a stencil member an opening in the shape of a closed loop that surrounds an inner portion of the stencil member. The closed loop is a continuous opening except for a plurality of web members, each of which extends across the opening to secure the inner stencil portion to the remainder of the stencil member. A glass slurry is forced through the opening of the stencil member onto a first substrate so as to form on the first substrate a substantially closed loop of glass slurry, which is thereafter glazed to form a glass loop that is bonded to the first substrate. The first substrate is next used as a cover plate and is placed over a second substrate containing an electronic device such that the glass loop surrounds the electronic device and contacts the second substrate along its entire length. Next, the glass is heated sufficiently to soften it and cause it to bond to the second substrate as well as the first substrate. Cooling of the glass loop develops continuous hermetic seals to both the first and second substrates, thereby to isolate the electronic device from the external environment.

The invention is beneficial in that it can be implemented inexpensively and is amenable to mass production techniques. For example, many glass slurry patterns can be defined on a plurality of substrates through a single stencil printing operation. The closed loop is preferably in the shape of a rectangle with four stencil web members extending across each of the corners. In spite of the inherent gaps in the closed loop of the slurry that is printed onto the substrate resulting from the web members, the final seal has been found to be dependably and continuously hermetically tight. This is because of an inherent flowing of the glass slurry after it has been printed to fill in the gap created by the web member. Other factors are the flow of the material during glazing and the pressure that causes the glazed glass seal to bulge slightly when the final seal to the second substrate is made. The substrates are preferably both of quartz which gives glass sealing and thermal matching advantages.

These and other objects, features and benefits of the invention will be better understood from a consideration of the following detailed description taken in conjunction with the accompanying drawing.

DETAILED DESCRIPTION

FIGS. 1 through 5 show in sequence a succession of steps for making an electronic device package in accordance with an illustrative embodiment of the invention.

Figure 1:
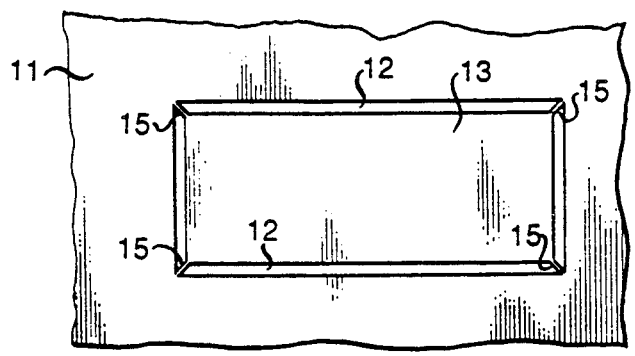
FIG. 1 is a top view of part of a stencil sheet made in accordance with an illustrative embodiment of the invention.

Referring now to FIG. 1, there is shown schematically a stencil sheet 11 within which openings 12 together describe a substantially closed loop. The closed loop surrounds an inner portion 13 of the stencil member. The closed loop is a continuous opening except for a plurality of web members 15, each of which extends across it to secure the inner stencil portion 13 to the remainder of the stencil member 11. In this case, the stencil openings 12 are together in the shape of a rectangle with the web members 15 extending across it at each of the four corners.

Figure 2:
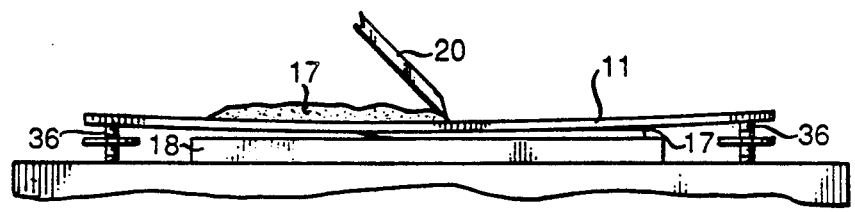
FIG. 2 is a schematic view illustrating stencil printing through the use of the stencil sheet of FIG. 1.

Referring to FIG. 2, the stencil member 11 is used to make a pattern of a glass slurry 17 on the upper surface of a cover plate 18 which may be made of quartz. In accordance with known stencil printing techniques, this is done by first including a quantity of glass slurry 17 on the upper surface of the stencil member 11 and then forcing the glass slurry through the openings 12 of FIG. 1 by using a wiper member or squeegee 20 to traverse the upper surface of the stencil member while bearing in a downwardly direction. In the operation shown in FIG. 2, the wiper member 20 is in the process of sweeping over the stencil member in a direction from right to left, thereby progressively forcing glass slurry 17 through the openings 12 onto the upper surface of the cover plate 18. Referring to FIG. 1, the wiper member 20 is sufficiently wide to sweep across all of the openings 12 as it is being drawn across the stencil member 11. As shown in FIG. 2, the stencil member is preferably made of a pliant material such as metal, which bows slightly as shown in response to the downward pressure exerted by wiper member 20.

Figure 3:
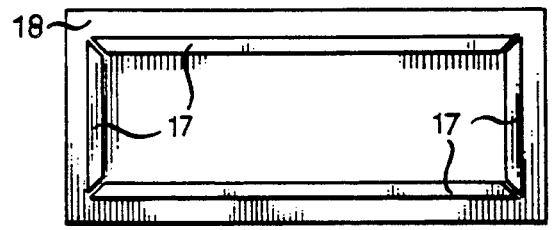
FIG. 3 is a view of a cover plate after the stencil printing operation of FIG. 2.

Referring to FIG. 3, after the stencil printing operation, a pattern of glass slurry is formed on the upper surface of cover plate 18, which corresponds to the stencil pattern of openings 12 of FIG. 1, that is, the glass slurry pattern forms a substantially rectangular closed loop. Next, the glass slurry 17 is heated to boil off a volatile carrier and thereafter it is again heated to a sufficient temperature to glaze or sinter the glass to firmly bond it to cover plate 18, which itself is preferably of glass or quartz. Sintering reduces the glass material to theoretical density, free of bubbles.

Figure 4:
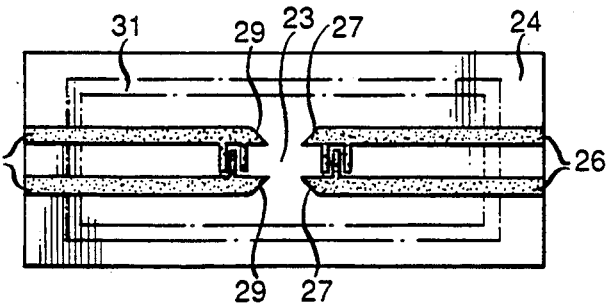
FIG. 4 is a top view of a surface acoustic wave (SAW) device, which is suitable for use with the invention.

The cover plate of FIG. 3 is intended to cover and hermetically seal a SAW device 23 shown schematically in FIG. 4. The SAW device 23 comprises a quartz plate 24 onto which are bonded a pair of metal strips 26, the ends of which constitute transducers 27. Opposite the transducers 27 are another pair of metal strips 28 and a pair of transducers 29. Electrical energy propagating from right to left on metal strips 26 are translated by transducers 27 into acoustic wave energy that propagates from right to left on the surface of quartz plate 24. Upon reaching transducers 29, the acoustic energy is translated back into electrical energy for transmission to the left by metal conductors 28. As is known, this process of energy translation can result in a useful filtering of the energy so that the electrical or electronic energy transmitted by conductors 28 is a filtered form of the input electrical energy on conductors 26. It can be appreciated that during operation, it is important that the region between the transducers 27 and 29 be kept free of contaminants, which would interfere with the propagation of acoustic energy.

Figure 5:
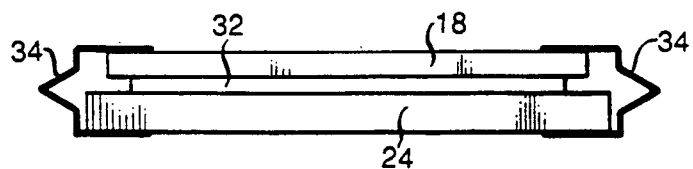
FIG. 5 is a schematic view showing the step of applying the cover plate of FIG. 3 to the SAW device of FIG. 4 so as to make a hermetic package in accordance with an illustrative embodiment of the invention.

In accordance with the invention, after the glass slurry 17 of FIG. 2 has been glazed, the cover 18 is fitted over SAW device 23 so that the glass loop surrounds the SAW device as shown by the phantom line 31 of FIG. 4. Referring to FIG. 5, 32 represents the pattern 17 of FIG. 3 after glazing. The cover plate 18 is positioned over quartz plate 24 such that the rectangular glass pattern 32 on the surface of cover plate 18 surrounds the SAW device as shown by the phantom loop 31 of FIG. 4. The cover plate 18 is held securely to the quartz plate 24 by two spring-loaded clamps 34. The assembly is then heated to reflow the closed glass loop 32 and cause it to seal to the quartz plate 24 as well as to the cover plate 18. We have found that an appropriate solder glass 32, when applied as described, can give a dependable hermetic seal of the SAW device; that is, after the sealing process, SAW device 23 of FIG. 4 is hermetically isolated from the external environment such that no or substantially no air or other particles can enter the region of the SAW device.

The glass that has been used for the glass seal 32 of FIG. 5 is known as PP-200 dielectric glass, which is commercially available from the Owens-Illinois, Inc. company of Toledo, Ohio. This glass comprises approximately eighty-three percent by weight of PbO, thirteen percent of $B_2O_3$, three percent of $Bi_2O_3$ and one-fourth to one-half percent of equal amounts of $SiO_2$, ZnO, and BaO. This is mixed at a rate of six or seven to one by weight of glass powder to a binder vehicle of a volatile liquid such as amyl acetate. 1.2 percent by weight of nitrocellulose is added for obtaining good binding and fluid viscosity. Finely grained glass powder mixed in this manner has an appropriate viscosity for application as shown in FIG. 2. The quartz (silicon dioxide) plates 18 and 24 are both oxide materials that bonds well with the glass seal. The metallizations 26 and 28 are preferably of aluminum that inherently form a coating of aluminum oxide which also bonds well to the glass sealant.

Referring to FIG. 1, the thickness of sheet 11 was five mils. The width of opening 12 was 0.020 inch. The length of each of the longer rectangular openings 12 was 0.720 inch and the length of each of the shorter openings was 0.307 inch. The web members 15 had a width of 0.008 inch. The separation distance between the lower surface of the unstressed stencil member 11 and the upper surface of cover plate 18 was ten mils. The stencil sheet was of stainless steel and during application it bowed as shown to contact lightly the surface of the cover plate 18. The stencil sheet was supported on another member, which for brevity has not been shown, and the resilience of the combined structure caused it to spring back to its original planar shape after its use. Adjustment screws 36 of FIG. 2 were used for controlling the gap between the stencil member and the upper surface of the cover plate 18.

After application of the glass slurry, the amyl acetate and nitrocellulose were vaporized by heating the glass slurry 17 of FIG. 3 at 260°–270° C. for one to two days. Thereafter, the slurry was glazed to make the glass sealant 32 by heating the cover plate 18 at 450° C. for 8.8 hours. Examination of the slurry pattern showed discernable gaps due to web members 15, but these gaps were clearly partly filled during the sintering or glazing process which apparently resulted in some reflow of the material. The assembly of FIG. 5 was clamped as shown and heated at 435° C. for eighteen minutes, which was found to be sufficient for causing reflow of the glazed sealant 32 while minimizing the heating of electronic device 23. The clip load was about two and one-half pounds. The final sealing has been done in a nitrogen atmosphere, which has been found to be sufficient for protective hermetic sealant purposes, but it could alternately be done in a vacuum, in air, or in an atmosphere of an inert gas such as argon.

Under the conditions described, we have found that the glass seal made by the final step shown in FIG. 5 is dependably hermetic despite the fact that the slurry is applied through an opening which has discontinuities caused by the webs 15 which are needed for securing in place the inner stencil portion 13 (of FIG. 1). The slurry 17 that we use has a viscosity of about forty centipoise, which is sufficiently thick to maintain its shape after printing and sufficiently thin to be stencil printed. At 450° C. the glazed or sintered glass loop 32 has a viscosity of about $10^4$ poise, but there is some flow to partially fill the gaps. The two and one-half pound clip load during final seal may cause some bulging which further fills the corner gaps to give hermetic sealing. We tried alternatively to use screen printing for defining the slurry patterns but have found that it was distinctly inferior to stencil printing primarily because of the need for careful cleaning after each run. Even with the widest screen mesh available, extensive cleaning was required to prevent subsequent partial blockage. We estimate that with successive web members separated by a distance of at least 0.20 inch, one inherently avoids the bridging of part of the stencil opening by remnant slurry which can subsequently cause a spurious blockage.

The ability to stencil print the slurry pattern greatly reduces the production cost of hermetic packages because a large number of substrates can be stencil printed simultaneously, although for reasons of brevity and conciseness this has not been shown. We project that with our invention, the cost of hermetic packages can be reduced over fifty percent with respect to the metal "can" packages presently used.

The specific glass composition used is only exemplary of many that could be used. The substrates could be of amorphous glass and give the same advantages of good glass bonding and thermal matching, or they could be of other materials. The stencil is preferably of stainless steel, but other materials could be used. Brass was used, but was found to be susceptible to abrading by the glass slurry. The web members 15 must be thick enough to support structurally the inner stencil portion 13 and yet thin enough that corner gaps in the slurry pattern will be dependably closed during the seal process. With these considerations in mind, it is recommended that web members 15 have a width of between 0.05 and 0.15 inch. Various other modifications and embodiments may be made by those skilled in the art without departing from the spirit and scope of the invention.

We claim:

1. A method for making a hermetically sealed package for an electronic device comprising the steps of:
   making in a stencil member an opening in the shape of a closed loop that surrounds an inner portion of the stencil member;
   the closed loop opening being an opening that is continuous except for a plurality of web members each of which extends across the opening to secure the inner stencil portion to the remainder of the stencil member;
   forcing a glass slurry through the opening onto a first substrate so as to form on the first substrate a substantially closed loop of glass slurry;
   glazing the slurry to form a glass loop that is bonded to the first substrate;
   placing the first substrate over a second substrate such that the glass loop surrounds an electronic device and contacts the second substrate along the entire length of the glass loop;
   heating the glass loop sufficiently to soften it and to cause it to bond to the second substrate;
   and cooling the glass loop so as to develop continuous hermetic seals to both the first and second substrates, thereby to isolate the electronic device from the external environment.

2. The method of claim 1 wherein:
   the closed loop opening is in the shape of a rectangle having four corners;
   and four web members each extend across the opening, each web member being located at one of the corners.

3. The method of claim 1 wherein:
   the glazed slurry comprises glass particles carried in a volatile liquid vehicle;
   the viscosity of the slurry being sufficiently thick to maintain its shape as a closed loop on the first substrate;
   and before glazing, the slurry is heated to volatilize the liquid vehicle.

4. The method of claim 3 wherein:
   the first and second substrates are both made such that the parts thereof that contact the closed loop of glass are made substantially of a glass.

5. The method of claim 4 wherein:
   the electronic device is a SAW device.

6. A process for making a hermetic seal package for a SAW device comprising the steps of:
   making in a stencil a plurality of elongated openings arranged end-to-end with successive openings being separated by a web member having a width of 0.05 to 0.15 inch;
   the openings defining a closed loop pattern;
   forcing a glass slurry through the opening onto a first substrate so as to form on the first substrate a substantially closed loop pattern of glass slurry;
   glazing the slurry to form a glass loop pattern that is bonded to the first substrate;
   placing the first substrate over a second substrate such that the glass loop surrounds a SAW device and contacts the second substrate along the entire length of the glass loop pattern;
   heating the glass loop pattern sufficiently to soften it to cause it to bond to the second substrate;
   and cooling the glass loop pattern so as to develop continuous hermetic seals to both the first and second substrates, thereby to isolate the SAW device from the external environment.

7. The process of claim 6 wherein:
   the closed loop pattern is in the shape of a rectangle having four corners with one web member being located at each of the corners.

8. The process of claim 7 wherein:
   the glazed slurry comprises glass particles contained in a volatile liquid vehicle;
   the viscosity of the slurry being sufficiently thick to maintain its shape as a closed loop pattern on the first substrate;
   and before glazing, the slurry is heated to volatilize the liquid vehicle.

9. The method of claim 8 wherein:
   the first and second substrates are made of an oxide material;
   and the SAW device comprises metallizations made on a surface of the second glass substrate.

10. The method of claim 9 wherein:
    during the step of heating and bonding to the second substrate, the first and second substrate are clamped together by a clamp that compresses together the first and second substrates.

11. The method of claim 10 wherein:
    the first and second substrate are made of quartz and the metallizations are aluminum having thereon a coating of aluminum oxide.

12. A method for making a hermetically sealed package for an electronic device comprising the steps of:

making in a stencil member an opening in the shape of a closed loop that surrounds an inner portion of the stencil member;

the closed loop opening being an opening that is continuous except for a plurality of web members each of which extends across the opening to secure the inner stencil portion to the remainder of the stencil member;

forcing a glass slurry through the opening onto a first substrate so as to form on the first substrate a substantially closed loop of glass slurry;

placing the first substrate with respect to a second substrate such that the glass loop surrounds an electronic device and contacts the second substrate along the entire length of the glass loop;

heating the glass loop sufficiently to cause it to bond to the first and second substrates;

and cooling the glass loop so as to develop continuous hermetic seals to both the first and second substrates, thereby to isolate the electronic device from the external environment.

13. The method of claim 12 wherein:
the closed loop opening is in the shape of a rectangle having four corners;
and four web members each extend across the opening, each web member being located at one of the corners.

14. The method of claim 12 wherein:
the glazed slurry comprises glass particles carried in a volatile liquid vehicle;
the viscosity of the slurry being sufficiently thick to maintain its shape as a closed loop on the first substrate;
and before glazing, the slurry is heated to volatilize the liquid vehicle.

15. The method of claim 14 wherein:
the first and second substrates are both made such that the parts thereof that contact the closed loop of glass are made substantially of a glass.

16. The method of claim 15 wherein:
the electronic device is a SAW device.

* * * * *